(12) United States Patent
Chang

(10) Patent No.: US 8,247,286 B2
(45) Date of Patent: Aug. 21, 2012

(54) SEMICONDUCTOR DEVICE HAVING TRANSISTOR AND METHOD OF MANUFACTURING THE SAME

(75) Inventor: Dong-Ryul Chang, Gyeonggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 163 days.

(21) Appl. No.: 12/712,260

(22) Filed: Feb. 25, 2010

(65) Prior Publication Data

US 2010/0148252 A1 Jun. 17, 2010

Related U.S. Application Data

(63) Continuation of application No. 12/268,031, filed on Nov. 10, 2008, now abandoned.

(30) Foreign Application Priority Data

May 28, 2008 (KR) ........................ 10-2008-0049674

(51) Int. Cl.
*H01L 21/8238* (2006.01)
(52) U.S. Cl. ........ 438/231; 438/163; 438/230; 438/267; 438/304; 438/305; 438/527; 438/532; 438/516; 438/519; 438/596; 438/621; 257/336; 257/344; 257/367; 257/408; 257/E21.435; 257/E21.437; 257/E21.445; 257/E21.446; 257/E21.623; 257/E21.637; 257/E29.152; 257/E29.154
(58) Field of Classification Search .................. 257/336, 257/344, 367, 408, E21.435, E21.437, E21.445, 257/E21.446, E21.623, E21.637, E29.152, 257/E29.154; 438/163, 230, 231, 267, 304, 438/305, 527, 532, 516, 519, 596, 621
See application file for complete search history.

(56) References Cited

U.S. PATENT DOCUMENTS

| | | | | |
|---|---|---|---|---|
| 5,028,556 A | * | 7/1991 | Chang | 438/218 |
| 5,650,654 A | | 7/1997 | Noble | |
| 5,804,496 A | * | 9/1998 | Duane | 438/520 |
| 5,977,591 A | * | 11/1999 | Fratin et al. | 257/344 |
| 6,555,446 B1 | | 4/2003 | Unnikrishnan | |
| 2003/0068874 A1 | * | 4/2003 | Jung et al. | 438/585 |
| 2005/0212050 A1 | | 9/2005 | Kim et al. | |
| 2007/0045675 A1 | | 3/2007 | Chen | |

FOREIGN PATENT DOCUMENTS

| | | |
|---|---|---|
| KR | 2005-0104163 | 11/2005 |
| KR | 2006-0098191 | 9/2006 |

\* cited by examiner

*Primary Examiner* — Meiya Li
(74) *Attorney, Agent, or Firm* — Muir Patent Consulting, PLLC

(57) ABSTRACT

One embodiment of inventive concepts exemplarily described herein may be generally characterized as a semiconductor device including an isolation region within a substrate. The isolation region may define an active region. The active region may include an edge portion that is adjacent to an interface of the isolation region and the active region and a center region that is surrounded by the edge portion. The semiconductor device may further include a gate electrode on the active region and the isolation region. The gate electrode may include a center gate portion overlapping a center portion of the active region, an edge gate portion overlapping the edge portion of the active region, and a first impurity region of a first conductivity type within the center gate portion and outside the edge portion. The semiconductor device may further include a gate insulating layer disposed between the active region and the gate electrode.

16 Claims, 8 Drawing Sheets

SEMICONDUCTOR DEVICE HAVING TRANSISTOR AND METHOD OF MANUFACTURING THE SAME

CROSS-REFERENCE TO RELATED PATENT APPLICATIONS

This application claims the benefit of priority to and is a continuation of U.S. patent application Ser. No. 12/268,031, filed on Nov. 10, 2008 now abandoned, which claims the benefit of Korean Patent Application No. 10-2008-0049674, filed on May 28, 2008, in the Korean Intellectual Property Office, the disclosure of each of which is incorporated herein in its entirety by reference.

BACKGROUND

Embodiments of inventive concepts exemplarily described herein relate generally to semiconductor devices including transistors and methods of manufacturing such semiconductor devices. More particularly, embodiments of inventive concepts exemplarily described herein relate to a semiconductor device including a transistor that includes a gate electrode extending throughout an isolation region and an active region, and a method of manufacturing such a semiconductor device.

SUMMARY

Embodiments of inventive concepts exemplarily described herein may be generally characterized as providing a semiconductor device including a transistor that can prevent an undesired hump from generating in a drain current that depends upon a gate voltage, which is caused by a parasitic transistor formed on an edge portion of an active region that is close to an interface between an isolation region and the active region.

Embodiments of inventive concepts exemplarily described herein may also be generally characterized as providing a method of manufacturing a semiconductor device including a transistor that can prevent an undesired hump from generating in a drain current that depends upon a gate voltage, which is caused by a parasitic transistor formed on an edge portion of an active region that is close to an interface between an isolation region and the active region.

One embodiment of inventive concepts exemplarily described herein may be generally characterized as a semiconductor device including an isolation region within a substrate. The isolation region may define an active region. The active region may include an edge portion that is adjacent to an interface of the isolation region and the active region and a center region that is surrounded by the edge portion. The semiconductor device may further include a gate electrode on the active region and the isolation region. The gate electrode may include a center gate portion overlapping a center portion of the active region, an edge gate portion overlapping the edge portion of the active region, and a first impurity region of a first conductivity type within the center gate portion and outside the edge portion. The semiconductor device may further include a gate insulating layer disposed between the active region and the gate electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE EMBODIMENTS

Hereinafter, embodiments of inventive concepts will be exemplarily described with reference to accompanying drawings as follows.

Figure 1A:
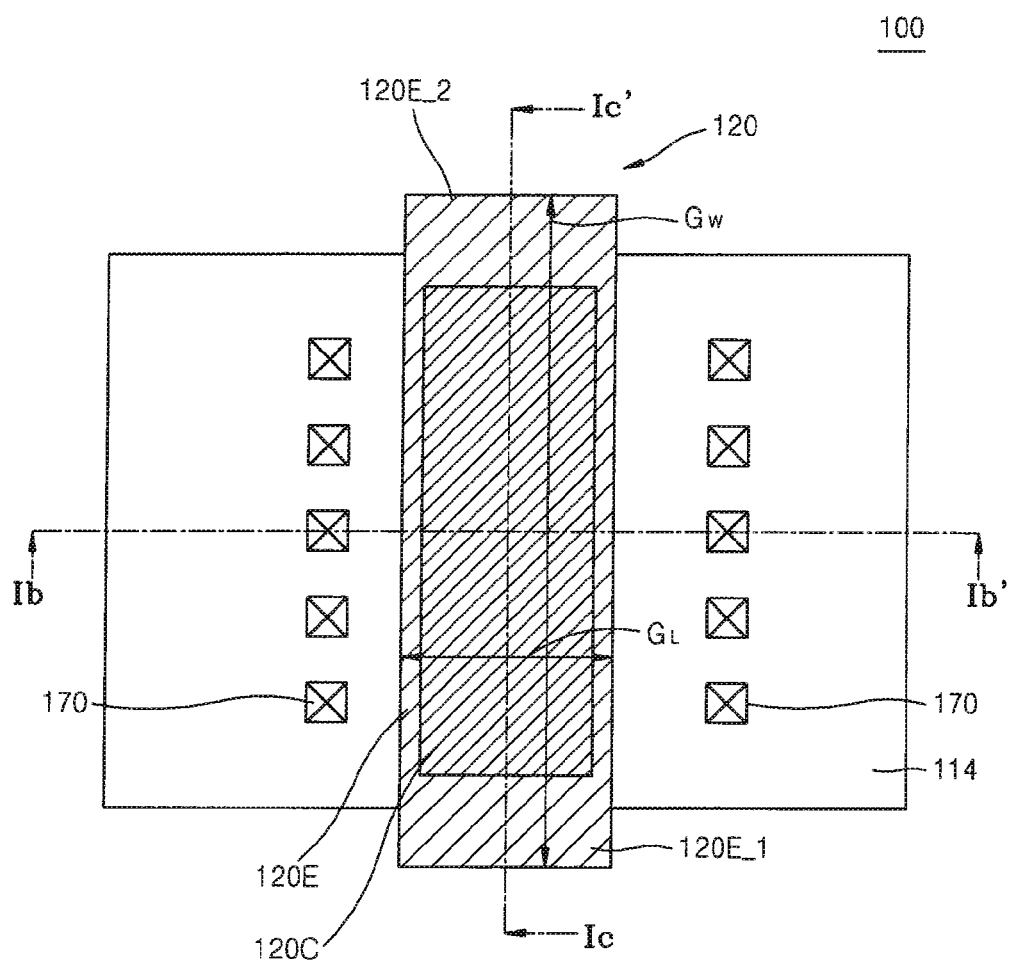
FIG. 1A is a plan view of a semiconductor device according to an embodiment.
Figure 1B:
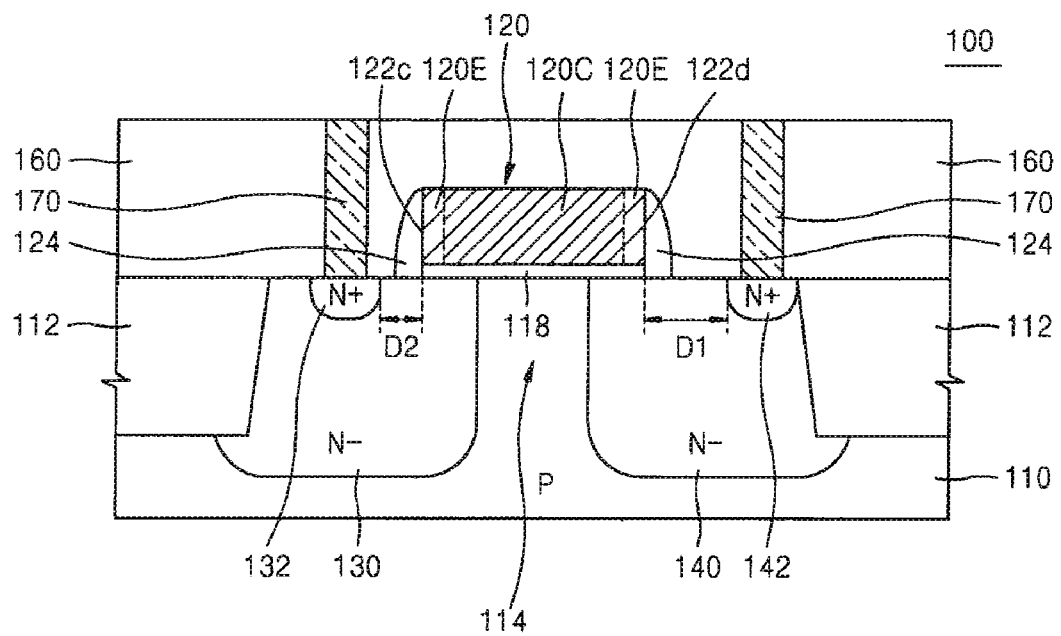
FIG. 1B is a cross-sectional view of the semiconductor device taken along line Ib-Ib' of FIG. 1A.
Figure 1C:
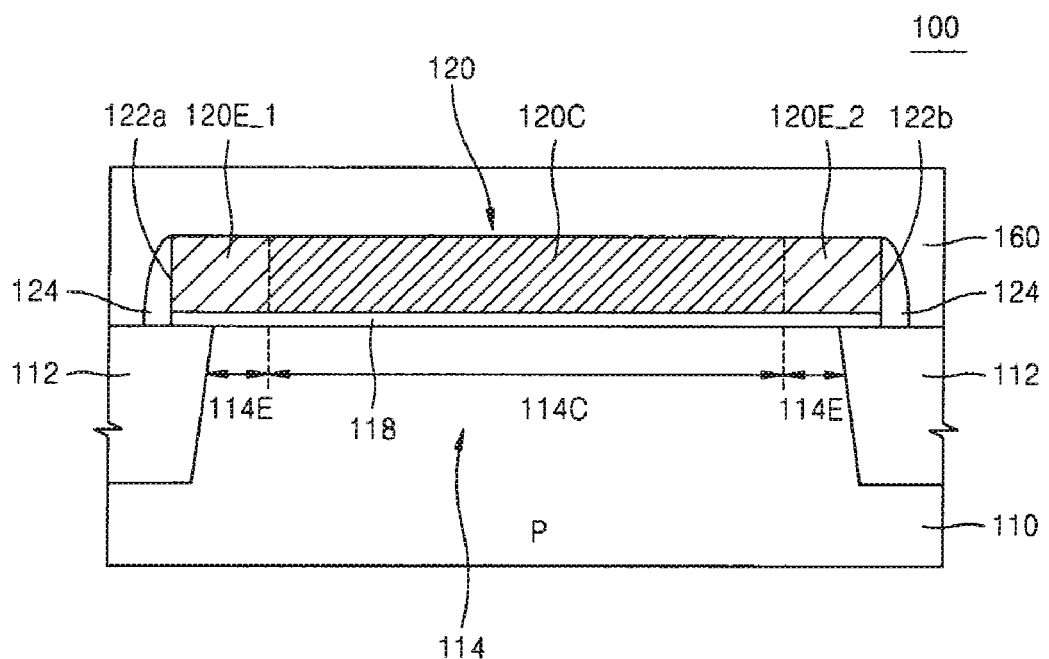
FIG. 1C is a cross-sectional view of the semiconductor device taken along line Ic-Ic' of FIG. 1A.

FIG. 1A is a plan view of a semiconductor device according to an embodiment, FIG. 1B is a cross-sectional view of the semiconductor device taken along line Ib-Ib' of FIG. 1A and FIG. 1C is a cross-sectional view of the semiconductor device taken along line Ic-Ic' of FIG. 1A.

Referring to FIGS. 1A, 1B, and 1C, the semiconductor device 100 may, for example, include an active region 114 defined by an isolation region 112 formed in a substrate 110.

The active region 114 includes an edge portion 114E that is adjacent to an interface between the active region 114 and the isolation region 112 and a center portion 114C surrounded by the edge portion 114E.

A gate electrode 120 is formed on the active region 114 and the isolation region 112 of the substrate 110. A gate insulating layer 118 is disposed between the active region 114 and the gate electrode 120.

A source region 132 and a drain region 142 are formed respectively on both sides of the gate electrode 120 in the active region 114. The source region 132 and the drain region 142 are doped with a high concentration of impurities. In addition, the active region 114 includes a source drift region 130 and a drain drift region 140, which respectively surround the source and drain regions 132 and 142. The source drift region 130 and the drain drift region 140 are doped with a lower concentration of impurities than the source region 132 and drain region 142. The source drift region 130 and the drain drift region 140 function as buffer regions to improve a junction breakdown voltage when high voltages are applied to the source region 132 and the drain region 142. In one embodiment, a distance D1 between the gate electrode 120 and the drain region 142 may be greater than a distance D2 between the gate electrode 120 and the source region 132 to ensure that the breakdown voltage between the drain region 142 and the substrate 110 is greater than a high voltage applied to the drain region 142.

An insulating spacer 124 is formed on a side wall of the gate electrode 120. A contact plug 170 penetrating an interlayer dielectric 160, which covers the gate electrode 120, is electrically connected to the source region 132 and the drain region 142.

The gate electrode 120 is formed to have a length $G_L$ and a width $G_W$. In one embodiment, the gate electrode 120 extends from the active region 114 to the isolation region 112 in a direction substantially perpendicular to the length $G_L$ direction, that is, substantially along the width $G_W$ direction of the gate electrode 120. The gate electrode 120 includes a first side wall 122a and a second side wall 122b on opposing end portions thereof in the width $G_W$ direction. The first and second side walls 122a and 122b are located on the isolation region 112. The first and second side walls 122a and 122b may be collectively referred to as a "first pair of opposing sidewalls." In addition, the gate electrode 120 includes a third side wall 122c and a fourth side wall 122d on opposing end portions thereof in the length $G_L$ direction. The third and fourth side walls 122c and 122d are located on the active region 114. The third and fourth side walls 122c and 122d may be collectively referred to as a "second pair of opposing sidewalls."

The gate electrode 120 includes a center gate portion 120C overlapping the center portion 114C of the active region 114, and an edge gate portion 120E surrounding the center gate portion 120C. The edge gate portion 120E includes a first edge gate portion 120E_1 and a second edge gate portion 120E_2 overlapping the edge portion 114E of the active region 114 on opposing end portions, which are respectively adjacent to the first and second side walls 122a and 122b. In FIGS. 1A and 1B, the edge gate portion 120E extends along the first and second side walls 122a and 122b and the third and fourth side walls 122c and 122d in the length $G_L$ direction and the width $G_W$ direction to surround the center gate portion 120C (e.g., as a ring-shaped edge gate portion 120E). However, embodiments of inventive concepts described herein are not limited to the above description. For example, the edge gate portion 120E may simply extend along the first and second side walls 122a and 122b in the length $G_L$ direction and, therefore, include the first edge gate portion 120E_1 and the second edge gate portion 120E_2.

In one embodiment, the gate electrode 120 may be formed of a material such as polysilicon. In another embodiment, the center gate portion 120C of the gate electrode 120 may be doped with impurities and the edge gate portion 120E of the gate electrode 120 may not be doped with impurities. That is, the edge gate portion 120E of the gate electrode 120 may be undoped. The impurities doped in the center gate portion 120C of the gate electrode 120 may be of a first conductivity type, which may be the same as the conductivity type of impurities doped in the source region 132 and the drain region 142 (e.g., N type impurities). Accordingly, the center gate portion 120C may include a first impurity region of a first conductivity type, the first impurity region containing a first concentration of impurities. In one embodiment, the first impurity region may be an N+ type impurity region.

According to one embodiment, the center gate portion 120C of the gate electrode 120 may be doped with impurities of the first conductivity type, which may be the same as the source region 132 and the drain region 142, and the edge gate portion 120E may be doped with impurities of a second conductivity type that is opposite to the first conductivity type. Accordingly, the edge gate portion 120E may include a second impurity region of a second conductivity type. However, the conductivity types of the impurities may be opposite in the above example. In addition, in the edge gate portion 120E, the doping concentration of impurities (i.e., the "impurity concentration") in the first edge gate portion 120E_1 may be the same as or different from the doping concentration of impurities in the second edge gate portion 120E_2.

In another embodiment, the center gate portion 120C and the edge gate portion 120E of the gate electrode 120 may be doped with impurities of the same conductivity type. Accordingly, the edge gate portion 120E may include a second impurity region of the first conductivity type. The doping concentration of impurities in the center gate portion 120C may be different from the doping concentration of impurities in edge gate portion 120E. For example, the impurities of first conductivity type, which are doped in the source region 132 and the drain region 142, can be doped in the center gate portion 120C at a relatively high concentration while the impurities of the first conductivity type can be doped in the edge gate portion 120E at a relatively low concentration.

In another embodiment, the center gate portion 120C of the gate electrode 120 may be doped with the impurities of the first conductivity type, which is the same as the conductivity type of the impurities doped in the source region 132 and the drain region 142, one of the first edge gate portion 120E_1 and the second edge gate portion 120E_2 may not be doped with impurities, and the other of the first edge gate portion 120E_1 and the second edge gate portion 120E_2 may be doped with impurities of the second conductivity type. Accordingly, one of the first edge gate portion 120E_1 and the second edge gate portion 120E_2 may be undoped and the other of the first edge gate portion 120E_1 and the second edge gate portion 120E_2 may include a second impurity region of a second conductivity type.

The transistor illustrated in FIGS. 1A, 1B, and 1C is an N type transistor, including an N+ type source region 132 and an N+ type drain region 142. However, embodiments of the inventive concepts are not limited to the above example, and a P type transistor including a P+ type source region 132 and a P+ type drain region 142 may be also be provided.

If first and second edge gate portions 120E_1 and 120E_2 of the gate electrode 120 are doped with impurities in the same manner as the center gate portion 120C, a depletion effect occurs at the first and second edge gate portions 120E_1 and 120E_2 located on the edge portion 114E of the active region 114, which is adjacent to the interface between the isolation region 112 and the active region 114. According to embodiments of inventive concepts exemplarily described herein, however: impurities may not be doped in at least one of the first and second edge gate portions 120E_1 and 120E2; a conductivity type of impurities doped in at least one of the first and second edge gate portions 120E_1 and 120E_2 may be the same as the conductivity type of impurities doped in the center gate portion 120C, but impurities may be doped in the at least one of the first and second edge gate portions 120E_1 and 120E_2 at a relatively lower concentration than impurities doped in the center gate portion 120C; and/or a conductivity type of impurities doped in at least one of the first and second edge gate portions 120E_1 and 120E_2 may be opposite to the conductivity type of impurities doped in the center gate portion 120C. Accordingly, an equivalent oxide thickness may be increased, and a potential difference ($\Phi_{ms}$) between work functions of the gate electrode 120 and the substrate 110 can be reduced. Therefore, a threshold voltage of the edge portion 114E of the active region 114, which is located under the first and second edge gate portions 120E_1 and 120E_2 of the gate electrode 120, increases. As a result, a hump phenomenon caused by undesired parasitic transistor does not occur on the edge portion 114E of the active region 114.

Figure 2A:
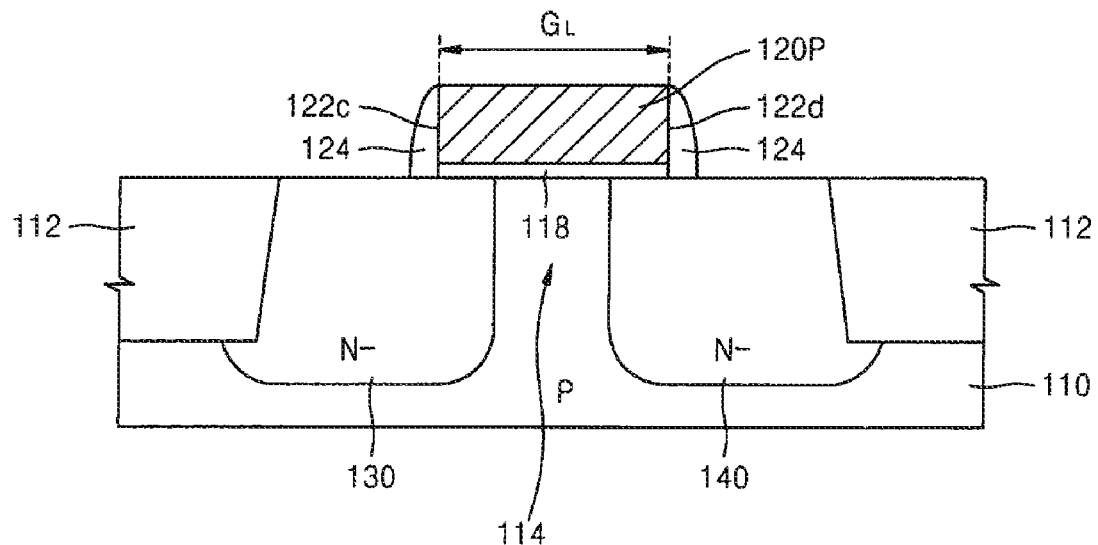
FIGS. 2A through 4B are cross-sectional views illustrating a method of manufacturing a semiconductor device according to an embodiment.

FIGS. 2A through 4B are cross-sectional views illustrating processes of manufacturing the semiconductor device according to an embodiment. Specifically, FIGS. 2A, 3A, and 4A are cross-sectional views of the semiconductor device taken along line Ib-Ib' of FIG. 1A and FIGS. 2B, 3B, and 4B are cross-sectional views of the semiconductor device taken along line Ic-Ic' of FIG. 1A. In FIGS. 2A through 4B, the same reference numerals as those of FIGS. 1A through 1C denote the same components, and detailed descriptions of those components will not be repeated.

Figure 2B:
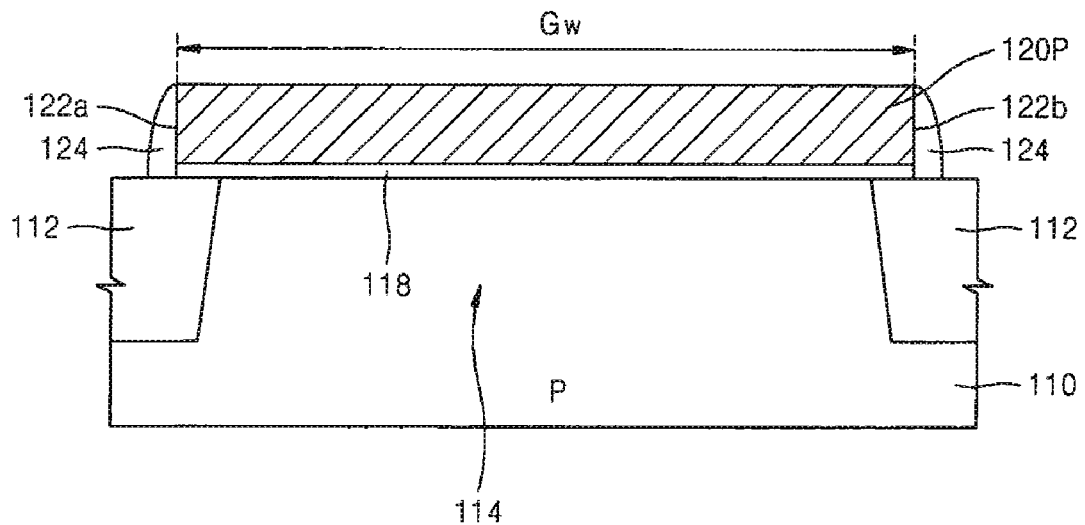

Referring to FIGS. 2A and 2B, an isolation region 112 is formed on the substrate 110, on which a well of a predetermined conductivity type is formed to define the active region 114. In one embodiment, the substrate 110 may be a silicon substrate. When an N type transistor is formed on the active region 114, the well is a P type well. When a P type transistor is formed on the active region 114, the well is N type well. For purposes of discussion only, the formation of an N type transistor will be described. It will be appreciated that the principles described herein may be applied to form a P type transistor.

After forming the isolation region 112, a low concentration of impurities are injected into a part of the active region 114 to form the source drift region 130 and the drain drift region 140 of N− type. For example, to form the source drift region 130 and the drain drift region 140, N type impurities such as phosphorous (P) can be injected into the active region at a dosage amount of about $5 \times 10^{11}$~$5 \times 10^{13}$ atoms/cm$^2$.

Then, a gate pattern 120P including the gate insulating layer 118 and a polysilicon layer that is not doped with impurities is formed on the active region 114 of the substrate 110. The insulating spacer 124 is also formed on a side wall of the gate pattern 120P. The first side wall 122a and the second side wall 122b of the gate pattern 120P, located on opposing end portions of the gate pattern 120P in the width $G_W$ direction, is located on the isolation region 112. Therefore, opposing end portions of the gate pattern 120P in the width $G_W$ direction cover the interface between the isolation region 112 and the active region 114. A third side wall 122c and the fourth side wall 122d, located on opposing end portions of the gate pattern 120P in the length $G_L$ direction, are located on the active region 114.

Figure 3A:
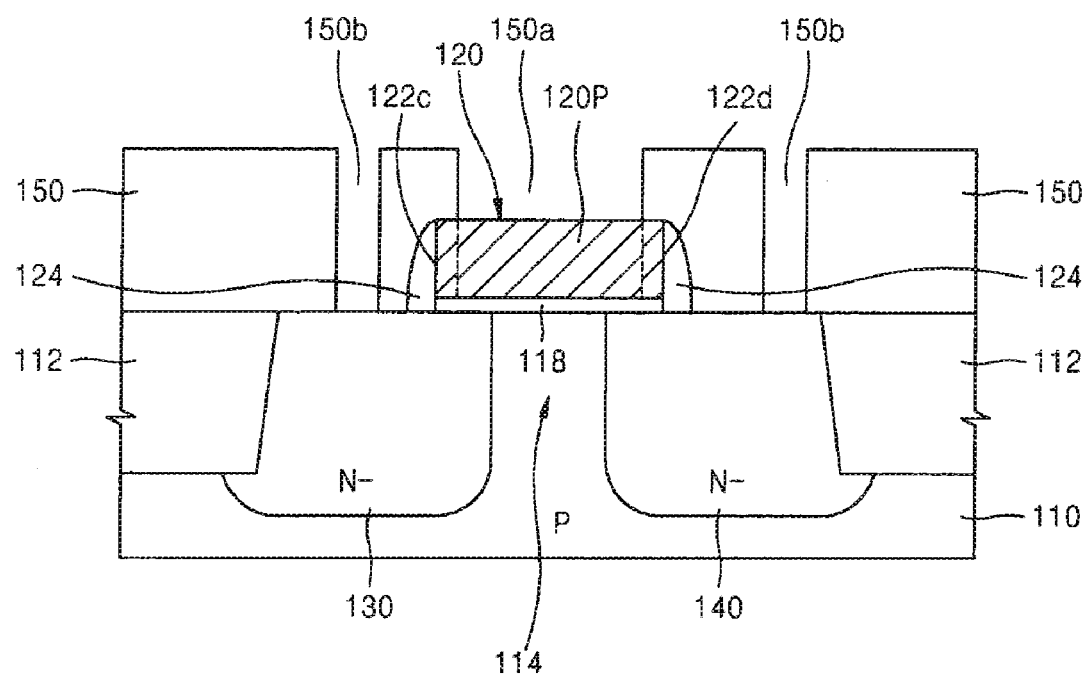
Figure 3B:
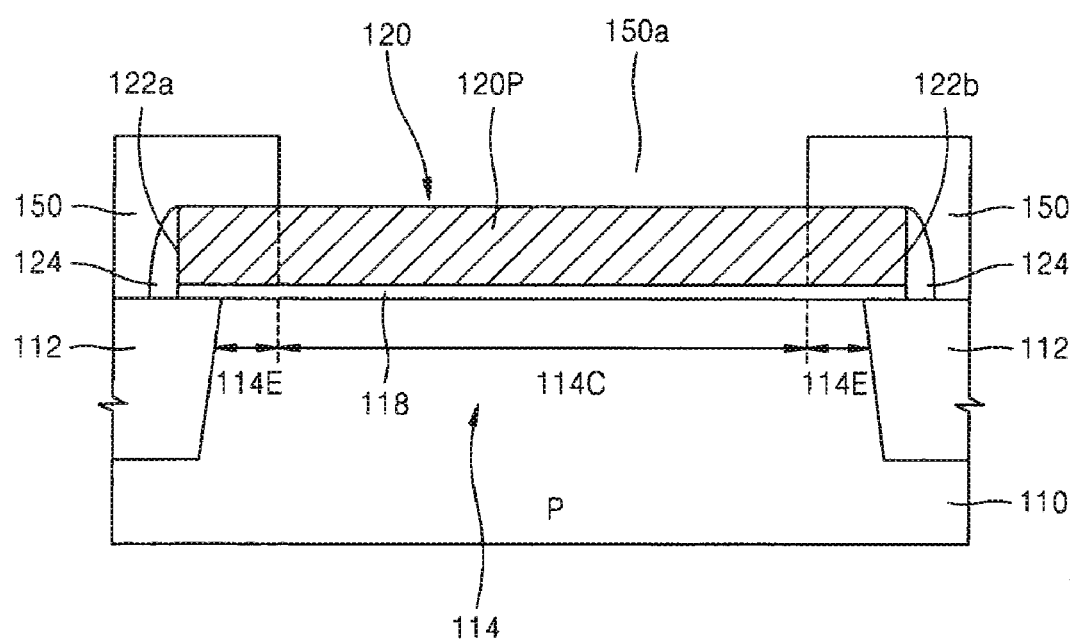

Referring to FIGS. 3A and 3B, a mask pattern 150 is formed on the gate pattern 120P and the substrate 110. The mask pattern 150 may cover the center portion 114C of the active region 114 and include a first opening 150a that exposes a center portion of the gate pattern 120P as well as a plurality of second openings 150b that expose some parts of the source drift region 130 and the drain drift region 140. In one embodiment, the mask pattern 150 can be a photoresist pattern.

Figure 4A:
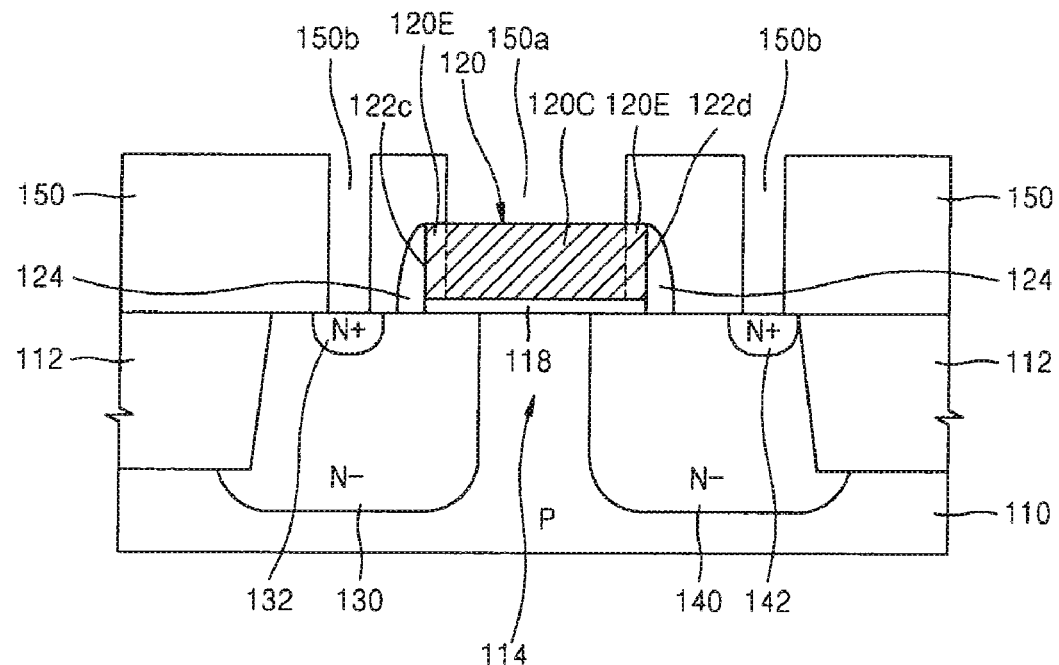
Figure 4B:
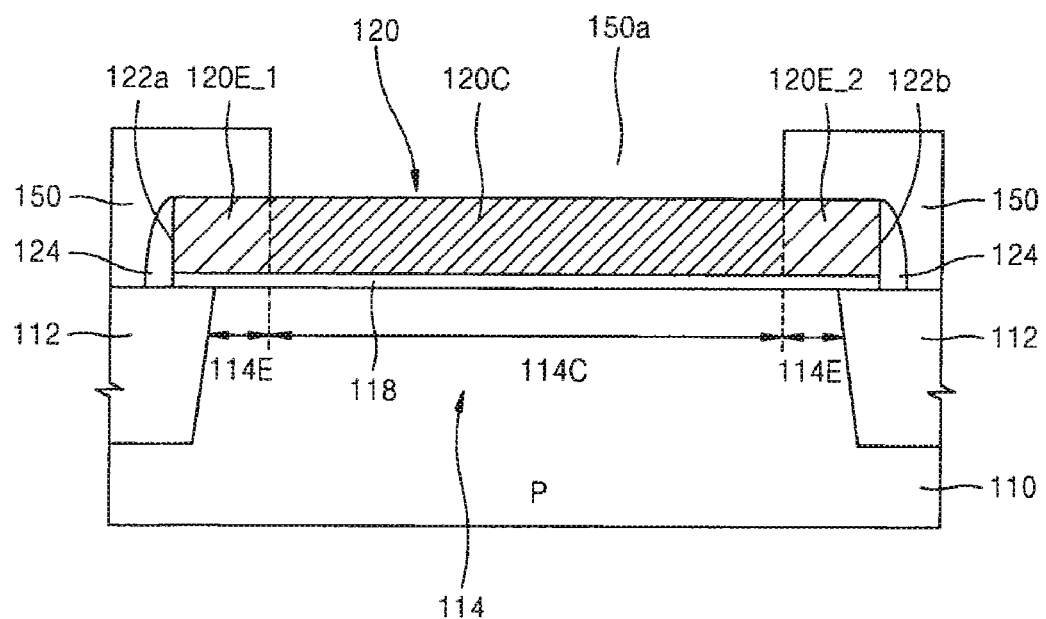

Referring to FIGS. 4A and 4B, a high concentration of impurities of the first conductivity type (N type impurities) are injected into the gate pattern 120P and the active region 114 through the first opening 150a and the plurality of second openings 150b formed in the mask pattern 150. As a result, the source region 132 and the drain region 142 of are formed at the same time as a center gate portion 120C, which is formed in the center portion of the gate pattern 120P, which are all doped with impurities of the first conductivity type. Accordingly, the gate electrode 120, including the center gate portion 120C doped with the impurities and the edge gate portion 120E that is not doped with impurities, is formed. To form the source region 132, the drain region 142 and the center gate portion 120C, N type impurities such as phosphorous (P) ions can be injected into the active region 114 and the gate pattern 120P at dosage of about $1 \times 10^{15}$~about $2 \times 10^{16}$ atoms/cm$^2$, thereby forming N+ type impurity regions.

Subsequently, the mask pattern 150 is removed and, as shown in FIGS. 1B and 1C, the interlayer dielectric 160 is formed between the gate electrode 120 and the substrate 110. In one embodiment, some parts of the interlayer dielectric 160 may be removed to form a plurality of contact holes exposing the source region 132 and the drain region 142 and contact plugs 170 may be formed in the contact holes to be electrically connected to the source region 132 and the drain region 142.

Although not shown in the drawings, a conductive layer for wiring that is electrically connected to the contact plugs 170 can be formed on the interlayer dielectric 160.

Figure 5A:
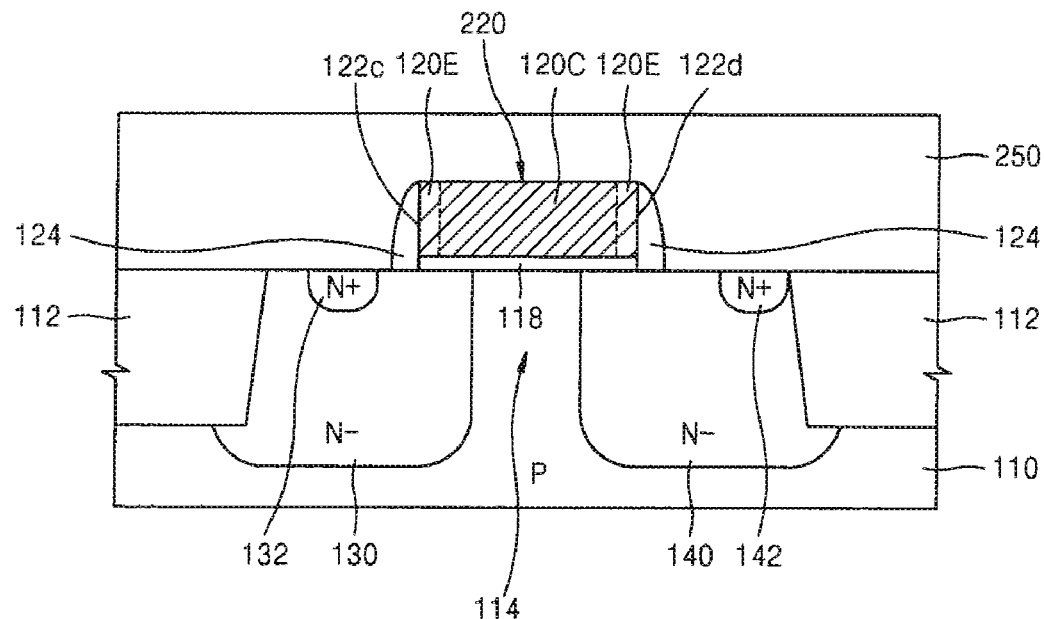
FIGS. 5A and 5B are cross-sectional views illustrating a method of manufacturing a semiconductor device according to another embodiment.
Figure 5B:
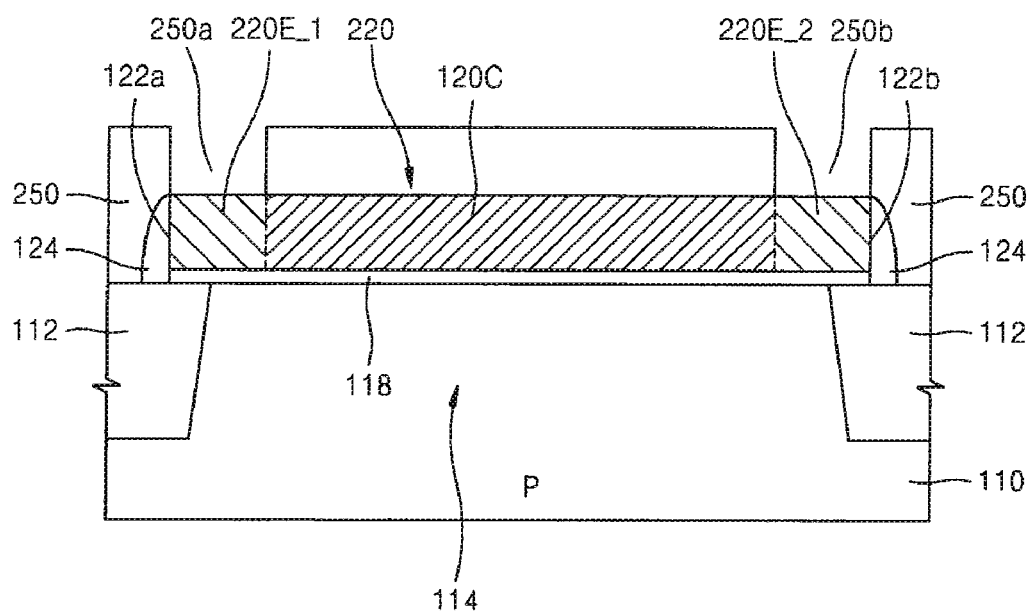

FIGS. 5A and 5B are cross-sectional views illustrating processes of manufacturing a semiconductor device according to another embodiment. Specifically, FIG. 5A is a cross-sectional view of the semiconductor device taken along line Ib-Ib' of FIG. 1A and FIG. 5B is a cross-sectional view of the semiconductor device taken along line Ic-Ic' of FIG. 1A. In FIGS. 5A and 5B, the same reference numerals as those of FIGS. 1A, 1B, 1C, and FIGS. 2A through 4B denote the same components, and detailed descriptions of the components will be omitted.

Referring to FIGS. 5A and 5B, the gate electrode 220, including the center gate portion 120C that is doped with impurities and the edge gate portion 120E that is not doped with impurities, is formed on the substrate 110 according to the method of manufacturing the semiconductor device exemplarily described with reference to FIGS. 2A through 4B. Subsequently, a mask pattern 250 including openings 250a and 250b, which selectively expose the first and second edge gate portions 220E_1 and 220E_2 of the gate electrode 220, is formed on the gate electrode 220 and the substrate 110. The mask pattern 250 can be a photoresist pattern.

Next, impurities of a second conductivity type opposite to the first conductivity type (e.g., P type impurities) are doped in the first and second edge gate portions 220E_1 and 220E_2 of the gate electrode 220 through the openings 250a and 250b formed in the mask pattern 250. Thus, first and second edge gate portions 220E_1 and 220E_2 doped with the impurities of second conductivity type can be formed as P or P+ type impurity regions. Accordingly, a gate electrode 220, including the center gate portion 120C doped with impurities of the first conductivity type and the first and second edge gate portions 220E_1 and 220E_2 doped with impurities of the second conductivity type, can be formed.

In one embodiment, the ion implantation process for forming the first and second edge gate portions 220E_1 and 220E_2 can be performed simultaneously with the ion implantation process for forming other regions of the substrate 110, for example, source and drain regions of a P type transistor on a PMOS transistor region (not shown), using the same mask pattern.

In another embodiment, the method of forming first and second edge gate portions 220E_1 and 220E_2 doped with impurities of the second conductivity type, which is described with reference to FIGS. 5A and 5B, can be performed before forming the center gate portion 120C, which is described with reference to FIGS. 4A and 4B, if necessary.

In one embodiment, the first and second edge gate portions 220E_1 and 220E_2 can have the same doping concentrations as each other. In another embodiment, the first and second edge gate portions 220E_1 and 220E_2 can have different doping concentrations from each other. In one embodiment the first and second edge gate portions 220E_1 and 220E_2 can be formed to have different doping concentrations from each other by performing a first ion implantation process using a mask pattern that selectively exposes one of the first and second edge gate portions 220E_1 and 220E_2, instead of using the mask pattern 250, and then performing a second ion implantation process using a mask pattern that selectively exposes the other of the first and second edge gate portions 220E_1 and 220E_2. The dose amounts in the first and second ion implantation processes can be set to be different from each other.

Although not shown in the drawings, instead of using the mask pattern 250 shown in FIGS. 5A and 5B, a mask pattern (not shown) including an opening that selectively exposes one of the first edge gate portion 220E_1 and the second edge gate portion 220E_2 can be formed and impurities of second conductivity type (e.g., P type or P+ type impurities) can then be selectively doped in one of the first edge gate portion 220E_1 and the second edge gate portion 220E_2, while no impurities are doped in the other of the first edge gate portion 220E_1 and the second edge gate portion 220E_2.

Although not shown in the drawings, impurities of the first conductivity type (e.g., N type impurities) may be injected through the openings 250a and 250b of the mask pattern 250 into the first and second edge gate portions 220E_1 and 220E_2 at a lower concentration than impurities of the first conductivity type that are injected into the center gate portion 120C.

After injecting impurities into the first and second edge gate portions 220E_1 and 220E_2, the interlayer dielectric 160 and the contact plugs 170 are formed on the gate electrode 220 and substrate 110 according to the process exemplarily described with respect to FIGS. 1B and 1C.

FIGS. 6 through 9 are graphs showing electrical characteristics of a transistor in a semiconductor device according to inventive concepts described herein with a transistor in a comparative semiconductor device.

For measuring the electrical characteristics shown in FIGS. 6 through 9, an N type transistor for a high voltage transistor was fabricated by forming an N+ type impurity region in the center gate portion of the gate electrode and leaving the edge gate portion of the gate electrode undoped, as exemplarily described above. A transistor in a comparative semiconductor device is provided as a high voltage N type transistor having fabricated under the same conditions as those of the semiconductor device of the present invention, except that an N+ impurity region is formed in the edge gate portion and the center gate portion of the gate electrode.

Figure 6:
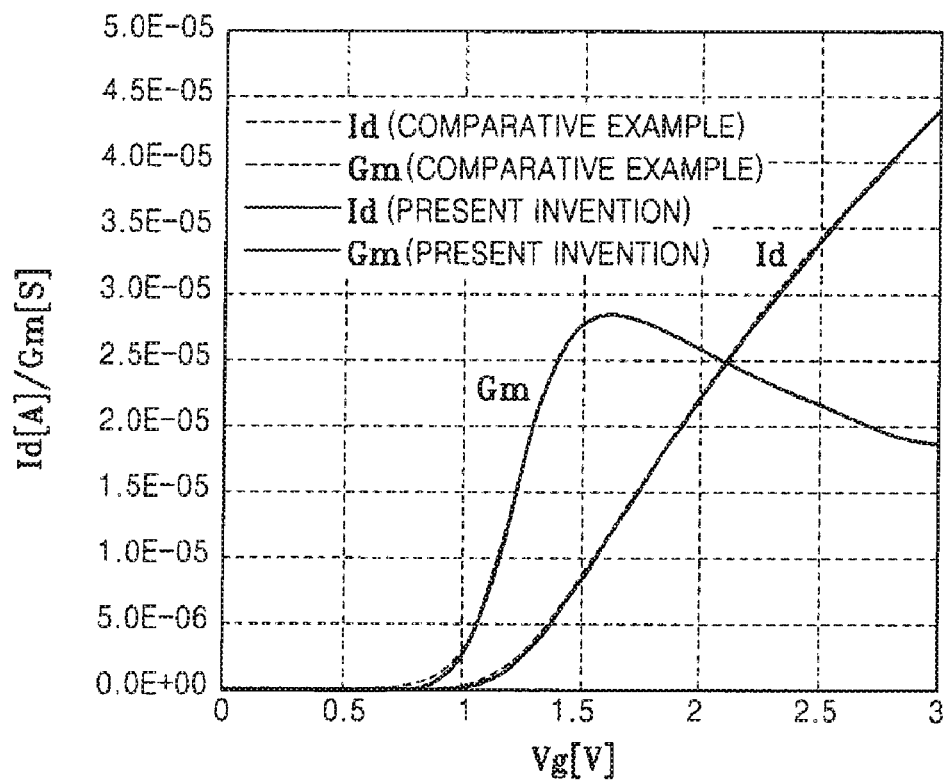
FIG. 6 is a graph comparing Id characteristics, transconductance (Gm) characteristics and Vg characteristics, when Vd is 0.1V, of a transistor in a semiconductor device according to inventive concepts described herein with those of a transistor in a comparative semiconductor device.

FIG. 6 is a graph comparing Id characteristics, transconductance (Gm) characteristics and Vg characteristics, when Vd is 0.1V, of a transistor in a semiconductor device according to inventive concepts described herein with those of a transistor in a comparative semiconductor device.

Referring to the graph of FIG. 6, even when the gate electrode of the transistor in the semiconductor device according to inventive concepts described herein includes dopant of the same conductivity type as that of the channel of the transistor only in the center gate portion of the gate electrode, Id, Gm and Vg characteristics that are similar to those of a transistor in a comparative semiconductor device can be obtained. When a threshold voltage Vth is defined using a Gm-Vg plot shown in FIG. 6, the Vth characteristic of the transistor is not affected even though dopant of the same conductivity type as that of the transistor channel is doped only in the center gate portion of the gate electrode, which corresponds to the center portion of the active region.

Figure 7:
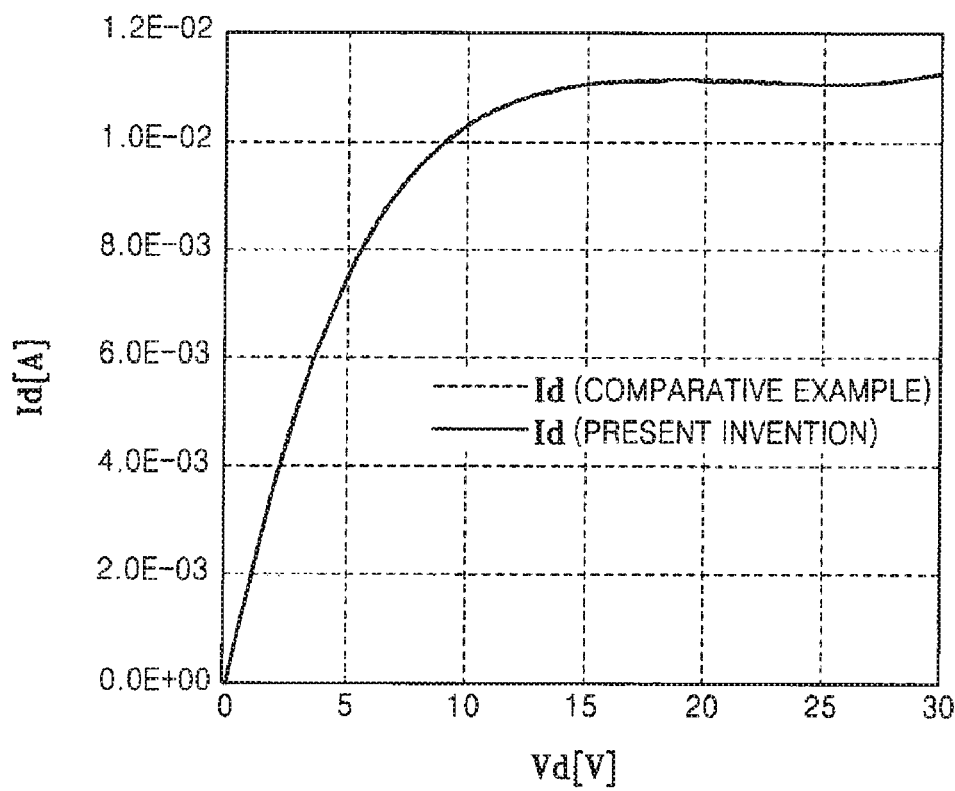
FIG. 7 is a graph comparing Id-Vd characteristics, when Vg is 30V, of a transistor in a semiconductor device according to inventive concepts described herein with those of a transistor in a comparative semiconductor device.

FIG. 7 is a graph comparing Id-Vd characteristics, when Vg is 30V, of a transistor in a semiconductor device according to inventive concepts described herein with those of a transistor in a comparative semiconductor device.

Referring to FIG. 7, even when the gate electrode of the transistor in the semiconductor device according to inventive concepts described herein includes dopant of the same conductivity type as that of the channel of the transistor only in the center gate portion of the gate electrode, which is located on the center portion of the active region, a saturation current characteristic that is the same as that of a transistor in a comparative semiconductor device can be obtained.

Figure 8:
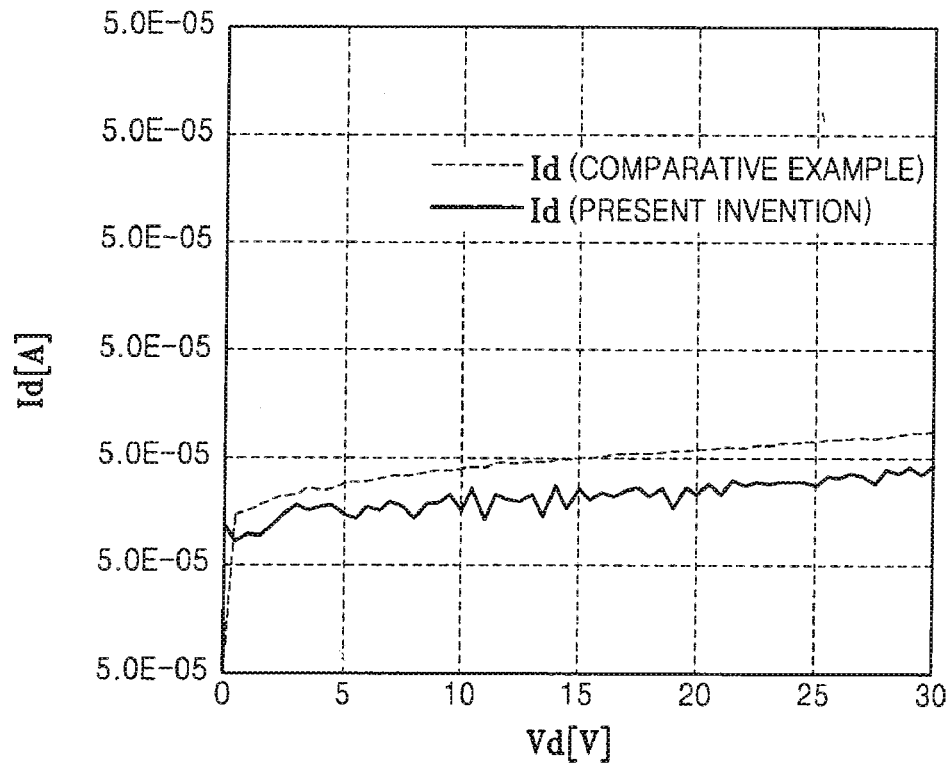
FIG. 8 is a graph comparing Id-Vd characteristics, when Vg is 0V, of a transistor in a semiconductor device according to inventive concepts described herein with those of a transistor in a comparative semiconductor device.
Figure 9:
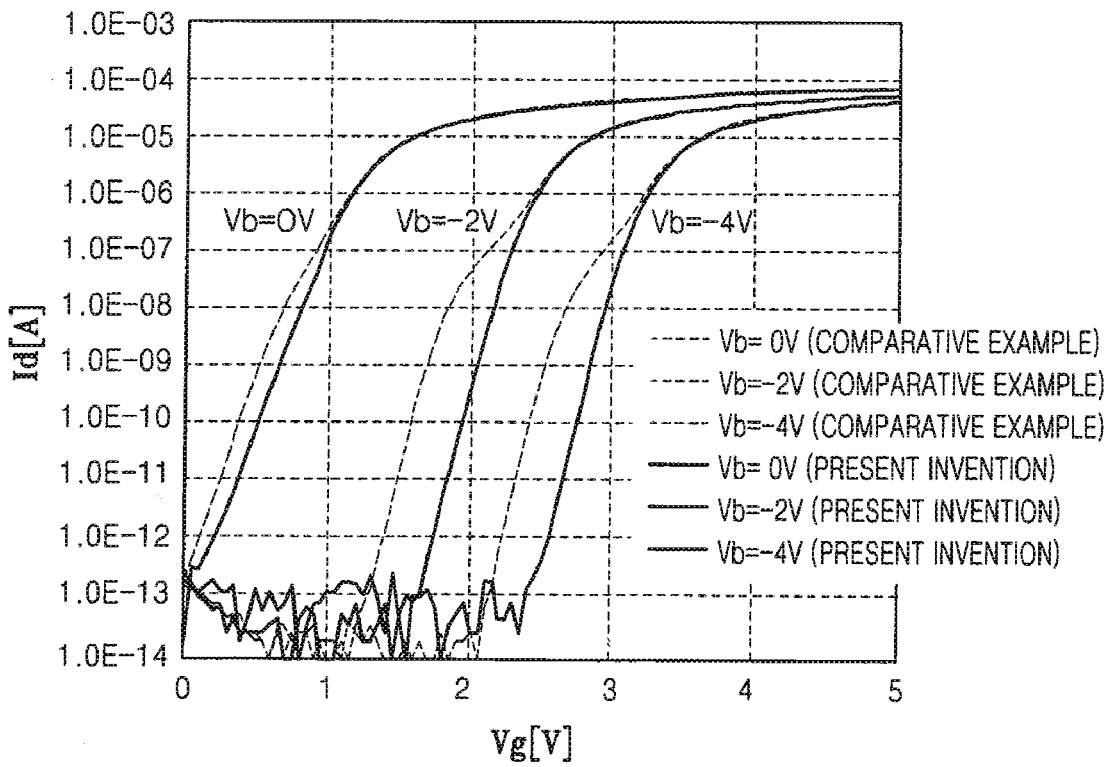
FIG. 9 is a graph comparing the Id-Vg characteristics, when Vd is 0.1V, of a transistor in a semiconductor device according to inventive concepts described herein with those of a transistor in a comparative semiconductor device.

FIG. 8 is a graph comparing Id-Vd characteristics in order to measure off-current (Ioff) characteristic, when Vg is 0V, of a transistor in a semiconductor device according to inventive concepts described herein with those of a transistor in a comparative semiconductor device. FIG. 9 is a graph comparing the Id-Vg characteristics, when a back bias voltage (Vb) is set as 0V, −2V, and −4V under a condition that Vd is 0.1V, of a transistor in a semiconductor device according to inventive concepts described herein with a transistor in a comparative semiconductor device.

According to According to FIGS. 8 and 9, even when the gate electrode of the transistor in the semiconductor device according to inventive concepts described herein includes dopant of the same conductivity type as that of the channel of the transistor only in the center gate portion of the gate electrode, which is located on the center portion of the active region, the Ioff characteristic of the present invention is reduced lower than that of the comparative example, and generation of the hump phenomenon can be restrained in the present invention.

According to embodiments exemplarily described above, impurities are not doped in the edge gate portion of the gate electrode, impurities of the same conductivity type are doped in the edge gate portion of the gate electrode and the center gate portion of the gate electrode but the edge gate portion of the gate electrode contains a relatively lower concentration of the impurities, or is doped with impurities of the same conductivity type as impurities that are doped in the, or impurities doped in the edge gate portion of the gate electrode have a different conductivity type than impurities doped in the center gate portion of the gate electrode. Therefore, the equivalent oxide thickness increases around the edge gate portion that is located on the edge portion of the active region, which is close to the interface between the isolation region and the active region, and a potential difference (Φms) between the work functions of the gate electrode and the substrate is reduced. Therefore, the threshold voltage Vth increases on the edge portion of the active region, which is located under the edge gate portion of the gate electrode. Therefore, the generation of hump phenomenon in the drain current Id in response to the gate voltage Vg, which is caused by the parasitic transistor on the edge portion of the active region, can be prevented.

It will be appreciated that embodiments of the inventive concepts exemplarily described herein may be practiced in many ways. What follows below is a general discussion of some exemplary embodiments.

One embodiment of the inventive concepts exemplarily described herein may be characterized as a semiconductor device including an active region defined by an isolation region in a substrate, and including an edge portion that is close to an interface between the isolation region and the active region and a center portion surrounded by the edge portion; a gate electrode formed on the active region and the isolation region, and including a center gate portion covering a center portion of the active region, an edge gate portion covering the edge portion of the active region, and a first impurity region of a first conductive type formed only in the center gate portion; and a gate insulating layer disposed between the active region and the gate electrode.

The edge gate portion may not be doped with impurities. The edge gate portion may include a second impurity region of a second conductive type, which is opposite to the first conductive type.

The semiconductor device may further include: a source region and a drain region, which are respective formed on the active region at both sides of the gate electrode, wherein the source region and the drain region are doped with impurities of the first conductive type.

The gate electrode may include a first end portion and a second end portion, which respectively extend to the isolation region, on both sides of the first impurity region. The edge gate portion may include a first edge gate portion formed in the first end portion and a second edge gate portion formed in the second end portion.

The first and second edge gate portions may not be doped with impurities. Each of the first edge gate portion and the second edge gate portion may include a second impurity region doped with impurities of a second conductive type that is opposite to the first conductive type. Impurities concentrations of the first edge gate portion and the second edge gate portion may be different from each other.

One of the first edge gate portion and the second edge gate portion may not be doped with impurities, and the other of the first edge gate portion and the second edge gate portion may include a second impurity region of a second conductive type that is opposite to the first conductive type.

The gate electrode may include: a pair of first side walls located on both sides of the first impurity region in a first direction and located on the isolation region; and a pair of second side walls located on both sides of the first impurity region in a second direction that is perpendicular to the first direction and located on the active region.

The first impurity region may be separated from the pair of first side walls and the pair of second side walls.

Another embodiment of the inventive concepts exemplarily described herein may be characterized as a method of manufacturing a semiconductor device. The method may include: forming an isolation region within a substrate to define an active region including an edge portion that is adjacent to an interface of the isolation region and the active region and a center portion that is surrounded by the edge portion; forming a gate insulating layer on the active region; forming a gate pattern on the gate insulating layer, the gate pattern overlapping the center portion and the edge portion of the active region and the isolation region; and forming a first impurity region of a first conductivity type selectively within a center portion of the gate pattern overlapping the center portion of the active region with respect to an edge portion of the gate pattern overlapping the edge portion of the active region.

The edge gate portion may include a first edge gate portion and a second edge gate portion formed at opposite sides of the center gate portion.

The method may further include: forming a low concentration impurity region of a first conductivity type on the active region before forming the gate insulating layer; and forming a high concentration impurity region of the first conductivity type in the lower concentration impurity region of the first conductivity type during the forming the first impurity region.

The method may further include: forming a second impurity region of a second conductivity type opposite the first conductivity type within the edge portion of the gate pattern. The second impurity region may be formed before or after the first impurity region is formed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
   forming a first isolation region and a second isolation region within a substrate to define an active region between the first and second isolation region;
   forming a gate insulating layer on the active region;
   forming a gate pattern on the gate insulating layer, the gate pattern overlapping the active region, wherein the gate pattern includes a length in a first direction and a width in a second direction perpendicular to the first direction, and wherein the gate pattern includes a first edge gate portion, a second edge gate portion opposite to the first edge gate portion in the first direction, a third edge gate portion, a fourth edge gate portion opposite to the third edge gate portion in the second direction, and a center gate portion being surrounded by the first through the fourth edge gate portions; and
   simultaneously forming a source region, a drain region, and a first impurity region, wherein all of the source region, the drain region, and the first impurity region are doped with impurities of a first conductivity type, wherein the source region and the drain region are formed in the active region, and wherein the first impurity region is formed selectively within the center gate portion of the gate pattern.

2. The method of claim 1, further comprising:
   forming low concentration impurity regions of a first conductivity type in the active region before forming the gate insulating layer, wherein the source region and the drain region are formed in the low concentration impurity regions during the forming the first impurity region.

3. The method of claim 1, further comprising:
   forming a second impurity region of a second conductivity type opposite to the first conductivity type within the first through fourth edge gate portions of the gate pattern.

4. The method of claim 3, wherein the second impurity region is formed after the first impurity region is formed.

5. The method of claim 3, wherein the second impurity region is formed before the first impurity region is formed.

6. The method of claim 1, further comprising:
   forming a second impurity region of a second conductivity type opposite to the first conductivity type in at least one of the first edge gate portion and the second edge gate portion.

7. The method of claim 6, wherein the second impurity region is formed in the first edge gate portion and the second edge gate portion and wherein an impurity concentration in the first edge gate portion is the same as an impurity concentration in the second edge gate portion.

8. The method of claim 6, wherein the second impurity region is formed in the first edge gate portion and the second edge gate portion and wherein an impurity concentration in the first edge gate portion is different from an impurity concentration in the second edge gate portion.

9. The method of claim 1, further comprising:
forming a second impurity region of the first conductive type in at least one of the first edge gate portion and the second edge gate portion, wherein an impurity concentration within the second impurity region of the at least one of the first edge gate portion and the second edge gate portion is less than an impurity concentration within the first impurity region.

10. The method of claim 9, wherein the gate pattern comprises polysilicon.

11. A method of manufacturing a semiconductor device, the method comprising:
forming a first isolation region and a second isolation region within a substrate to define an active region between the first and second isolation region;
forming a gate insulating layer on the active region;
forming a gate pattern on the gate insulating layer, the gate pattern including a ring-shaped edge gate portion and a center gate portion, the ring-shaped edge gate portion including a first edge gate portion, a second edge gate portion opposite to the first edge gate portion in a first direction, a third edge portion, and a fourth edge gate portion opposite to the third edge gate portion in a second direction perpendicular to the first direction, the center gate portion being surrounded by the first through the fourth edge gate portion, wherein the first and second edge gate portions partially overlap; a first interface between the first isolation region and the active region, and a second interface between the second isolation region and the active region, wherein the first through the fourth edge gate portions include a first side wall, a second sidewall, a third sidewall and a fourth sidewall of the gate electrode, respectively, the first sidewall and the second sidewall being located on both sides of the center gate portion in the first direction and overlapping the first and the second isolation regions, and the third sidewall and the fourth sidewall being located on both sides of the center gate portion in the second direction and overlapping the active region; and
simultaneously forming a source region, a drain region, and a first impurity region, wherein all of the source region, the drain region, and the first impurity region are doped with impurities of a first conductivity type, wherein the source region and the drain region are formed in the active region, and wherein the first impurity is formed selectively within the center gate portion of the gate pattern.

12. The method of claim 11, further comprising:
forming a second impurity region of a second conductivity type opposite to the first conductivity type in at least one of the first edge gate portion and the second edge gate portion.

13. The method of claim 12, wherein the second impurity region is formed in the first edge gate portion and the second edge gate portion and wherein an impurity concentration in the first edge gate portion is the same as an impurity concentration in the second edge gate portion.

14. The method of claim 12, wherein the second impurity region is formed in the first edge gate portion and the second edge gate portion and wherein an impurity concentration in the first edge gate portion is different from an impurity concentration in the second edge gate portion.

15. The method of claim 11, further comprising:
forming low concentration impurity regions of the first conductivity type in the active region before forming the gate insulating layer; and
forming high concentration impurity regions of the first conductivity type in the low concentration impurity regions of the first conductivity type during the forming the first impurity region.

16. The method of claim 15, further comprising:
forming a second impurity region of a second conductivity type opposite to the first conductivity type in the ring-shaped edge gate portion.

* * * * *